United States Patent

[11] 3,581,210

[72] Inventor Warren U. Amfahr
3100 Brookview Drive, Plano, Tex. 75074
[21] Appl. No. 793,438
[22] Filed Jan. 23, 1969
[45] Patented May 25, 1971

[54] RF T-PAD LOW IMPEDANCE COUPLING CIRCUIT ATTENUATOR WITH AGC VOLTAGE CONTROL
9 Claims, 4 Drawing Figs.

[52] U.S. Cl. .......... 325/411, 325/362, 325/414
[51] Int. Cl. .......... H04b 1/18
[50] Field of Search .......... 325/411, 413, 414, 415, 397, 400, 380, 381, 362; 307/264, 317; 330/145

[56] References Cited
UNITED STATES PATENTS
3,428,910 2/1969 Webb .......... 330/29

*Primary Examiner*—Benedict V. Safourek
*Assistant Examiner*—Kenneth W. Weinstein
*Attorneys*—Warren H. Kintzinger and Robert J. Crawford

ABSTRACT: An RF signal path variable attenuation circuit with common electrode connected diodes in the signal path and the diode interconnection connected through a transistor to ground. A voltage diode biasing circuit is also so connected in the circuit that the degree of voltage bias to conduction of the diodes is subject to variation through variable DC drain from the diode junction through the transistor along with, simultaneously, variable RF signal diversion to ground as controlled by AGC voltage variations applied at the transistor base.

Figures 1, 2, 3A, 3B:
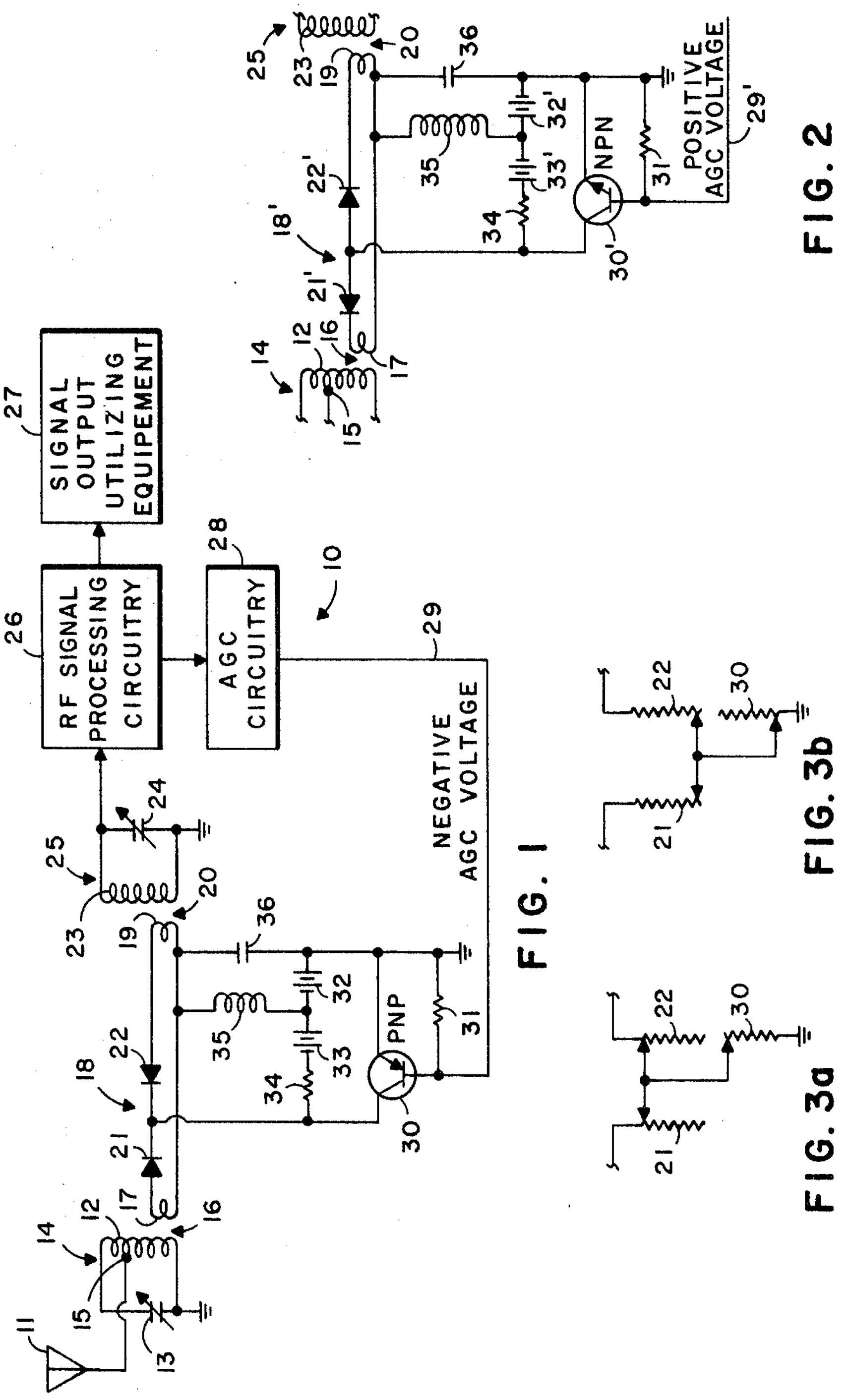

INVENTOR.
WARREN U. AMFAHR
BY Warren H. Kintzinger
ATTORNEY

RF T-PAD LOW IMPEDANCE COUPLING CIRCUIT ATTENUATOR WITH AGC VOLTAGE CONTROL

This invention relates to AGC circuits, and in particular, to an automatic gain control system controlling RF signal amplitude through a low impedance RF T-Pad signal coupling attenuator forward in the signal path from a first amplifier stage.

With most conventional RF receiver AGC (automatic gain control) circuit systems a rectified control voltage is derived from a stage near the output of the receiver and reapplied to control amplification of RF amplifier staging near the receiver input. In accord with rather fundamental principles such AGC voltages are more effective by degree with application to the lowest level of amplification or first stage or stages from the receiver input. Actually, it would prove most advantageous were an automatic gain control system so constructed as to derive its control voltage after the last amplification stage of a receiver and for this AGC voltage to be applied for RF signal amplitude control in the signal path of the receiver before or ahead of the first RF amplifier stage in the receiver.

It is, therefore, a principal object of this invention to provide a very responsive, highly reliable system of AGC with RF signal level gain control applied in the signal path prior to RF amplifier staging.

Another object with such an AGC system is to provide control of input signal attenuation through a low impedance T-Pad RF signal coupling circuit.

A further object is to minimize power or voltage amplification requirements in an AGC system and to readily achieve a higher degree of linearity in RF signal attenuation control.

Features of this invention useful in accomplishing the above objects include, in a improved automatic gain control system controlling RF signal amplitude through attenuation control prior, in the signal path, to signal amplification, a T-Pad (T-Bridge) connection of voltage controlled variable resistance type diodes in series with the RF signal path, and also an AGC voltage controlled transistor shunting the RF signal path. With this circuit configuration in normally a low impedance RF signal path a wide variable impedance adjustment is attainable with linear control characteristcs. It is an AGC system wherein the AGC derived DC voltage may be, and generally would be derived from a high impedance source section of RF signal processing circuitry. Further, with the RF shunt transistor also serving as a DC amplifier the AGC control derived voltage may be of extremely low value even at its strongest without sacrifice of desired AGC attenuation control.

Specific embodiments representing what are presently regarded as the best modes of carrying out the invention are illustrated in the accompanying drawing.

In the drawing:

FIG. 1 represents a schematic diagram of an RF T-Pad low impedance coupling circuit attenuator subject to AGC voltage control;

FIG. 2, a partial schematic of another embodiment similar in most respects to the embodiment of FIG. 1 using, however, a positive AGC voltage for attenuation control and with various components reversed as required for polarity correctness consistencies; and, FIG. 3A and 3B, equivalent circuits for the two opposite extreme limit AGC voltage T-Pad controlled operational states.

Referring to the drawing:

With the RF signal receiving system 10 of FIG. 1 the RF signals received by antenna 11 are fed to tunable LC coil 12 and capacitor 13 subcircuit 14. This is with the antenna lead connected to tap 15 of coil 12 and the capacitor 13 an adjustable capacitor connected between one end of coil 12 and ground at the other end in common with the other end of coil 12. Coil 12 also forms the primary coil of an RF signal coupling transformer 16 with a secondary coil 17 directly connected for signal input to low impedance RF T-Pad signal coupling attenuator circuit 18. The T-Pad circuit 18 includes at its other end, the signal output end, a primary coil 19 of an RF signal coupling transformer 20, and between the two opposite end coils 17 and 19 two resistance type diodes 21 and 22 having anodes connected to an individual end of coils 17 and 19, respectively. The cathodes of diodes 21 and 22 are common connected and the other ends of coils 17 and 19 are directly interconnected.

The secondary coil 23 of RF signal coupling transformer 20 is, along with tunable capacitor 24, part of a tunable LC subcircuit 25. One end of tunable subcircuit 25 is connected to ground and the other end as the signal path is connected to RF signal processing circuitry 26 providing an output to utilizing equipment 27, and from which AGC circuitry 28 develops a negative voltage output on line 29. The negative AGC voltage line 29 is connected to the base of PNP transistor 30 with an emitter connection directly to ground and a collector connection to the common cathode connection of diodes 21 and 22. A bias resistor 31 is connected between the base of transistor 30 and ground. Two batteries 32 and 33 (or their equivalent) along with a relatively high impedance load resistor 34 are series connected between ground and the transistor collector-diode connection with the positive terminal of battery 32 to ground and negative terminal to positive terminal of battery 33. The negative terminal of battery 33 is connected through resistor 34 to the transistor 30 collector-diode connection. The directly connected ends of coils 17 and 19 are also connected through RF choke coil 35 to the common junction of batteries 32 and 33, and also through RF bypass capacitor 36 to ground. These interconnections provide for voltage biasing of diodes 21 and 22 by battery 33, and voltage bias between the emitter and collector of PNP transistor 30 through both batteries 32 and 33.

The embodiment of FIG. 2, being much the same as the embodiment of FIG. 1, is given the same numbers for duplicated components and primed numbers, as a matter of convenience, for those components reversed or changed in adaption to positive AGC voltage control in place of the negative AGC voltage approach of FIG. 1. In the embodiment of FIG. 1. In the embodiment of FIG. 2 diodes 21′ and 22′ and batteries 32′ and 33′ are reversed from their counterparts in FIG. 1. Further, PNP transistor 30 is replaced by NPN transistor 30′ and AGC line 20′ is a positive AGC voltage line. Operation of this embodiment is substantially the same as with the embodiment of FIG. 1 keeping in mind the component reversals and PNP to NPN transistor change consistent with the switch from a negative to positive AGC voltage system.

During operation with weak signal levels the AGC voltage applied to the base of transistor 30 is zero or at least approaches its minimum from more significant negative level obtained from relatively stronger signals with the embodiment of FIG. 1. When substantially no voltage is applied to the base the collector to emitter resistance through PNP transistor 30 is at an extremely high maximum with, therefore, minimum current flow through load resistor 34 and transistor 30. In this operational state the voltage drop developed across load resistor 34 is low and the DC developed between the common connection of diodes 21 and 22 and the common connection of batteries 32 and 33 is at a maximum as reflected by a maximum DC derived negative voltage level at the common cathode connection of the diodes 21 and 22. Under these conditions diodes 21 and 22 are biased for maximum signal transmission with minimal RF attenuation therethrough. Further, any RF signal bleed off to ground is minimal under these conditions of operation so that, as a result, under such weak signal conditions RF attenuation is minimized. However, at the strongest operational signal levels the AGC voltage developed and applied at the base of transistor 30 is at its most negative level with, thereby, transistor collector to emitter resistance made extremely low. This results in maximum current flow through the load resistor 34 and through transistor 30 to ground and, thereby, the voltage drop developed across load resistor 34 being at its highest. As a consequence the DC developed between the common connection of diodes 21 and 22 and the common connection of batteries 32 and 33 is minimal and the voltage level at the common connection of the diodes approaches zero. This results in RF conduction in the signal path through the diodes being extremely low with maximum operational attenuation therethrough consistent with minimal biasing to conduction thereof. The additional system RF signal attenuation attained through RF conduction to ground through the transistor 30 from the common cathode connection of diodes 21 and 22 is also at a maximum.

For any signal level between these operational minimum and maximum signal strength conditions a consistent interim AGC developed DC negative level voltage is applied at the base of transistor 30. The RF signal attenuation variation provided between the operational signal limits may have improved linearity or be directionally weighted within the attenuation variation range provided as determined by the components used in meeting desired system performance objectives. This is with, in other words, a relatively strong negative base voltage causing the transistor to pass RF from the common junction of the diodes to ground. Simultaneously, this also removes, by draining to ground, to a greater or lesser extent as determined by signal strength and the resulting AGC voltage developed, through the transistor a measure of the DC potential developed at the common junction of the diodes. This lessening of the bias to conduction voltage causes the diodes to increase signal path resistance and RF signal attenuation therethrough. A lessening of negative AGC voltage at the base of the transistor with weakening of the signal causes the reverse of these actions. The transistor is more resistive to RF signal flow to ground and also to DC flow therethrough and the negative voltage at the junction of the diodes is increased. These factors cooperatively, under this condition of operation, result in the diodes becoming less resistive and thereby, consistently, a lessening of RF attenuation in the signal path.

Components and values used in an RF T-Pad low impedance coupling circuit attenuator subject to AGC negative voltage control according to applicant's teaching include the following:

| | |
|---|---|
| Transformer Coils 17 and 19 | 50 Ohm Impedance |
| Diodes 21 and 22 | 1N840 |
| PNP Transistor 30 | 2N1309 |
| Resistor 31 | 470K Ohms |
| Battery 32 | 15 Volts DC |
| Battery 33 | 3 Volts DC |
| Resistor 34 | 4.7K Ohms |
| Choke Coil 35 | 100$\mu$h |
| Capacitor 36 | 0.01$\mu$f |

Whereas this invention is here illustrated and described with respect to two specific embodiments thereof, it should be realized that various changes may be made without departing from the essential contribution to the art made by the teachings hereof.

I claim:

1. A signal path variable attenuation circuit including: input signal coupling means, and output signal coupling means; first circuit means, and second circuit means interconnecting said input and output signal coupling means; said first circuit means having two resistance type diodes with a common electrode interconnection, and with RF signal diode impedance variable through a range as controlled by diode bias variation; a transistor having a base electrode connected to a variable voltage control source, a collector connected to said diode common electrode interconnection, and an emitter connected to ground for providing a variable high to low impedance RF path to ground from said diode common electrode interconnection through said transistor to ground; a first DC potential developing source connected between ground and the common junction of said collector and said diode common electrode interconnection; with impedance means connected between said second circuit means and ground; and a load resistor connected in series with said first DC potential developing source between ground and the common junction of said collector and said diode common electrode interconnection.

2. The signal path variable attenuation circuit of claim 1 wherein, a resistor is connected between said transistor base and ground.

3. The signal path variable attenuation circuit of claim 1 wherein, said impedance means is a choke coil; and a second DC potential developing source connected between said choke coil and ground.

4. The signal path variable attenuation circuit of claim 3 wherein, said first DC potential developing source is connected through said second DC potential source to ground.

5. The signal path variable attenuation circuit of claim 4 wherein, an RF bypass capacitor is connected between said second circuit means and ground; and said load resistor is connected in series with said first DC potential developing source between said second DC potential developing source and the transistor collector common connection with the diode interconnection.

6. The signal path variable attenuation circuit of claim 5 wherein, said two resistance type diodes are common cathode connected diodes; said transistor is a PNP-type transistor; and said variable voltage control source is a variable negative voltage source.

7. The signal path variable attenuation circuit of claim 5 wherein, said two resistance type diodes are connected in common anode connected relation; said transistor is a NPN-type transistor; and said variable voltage control source is a variable positive voltage source.

8. AGC signal path variable attenuation circuit of claim 5 wherein said variable attenuation circuit is in the signal path of an RF signal receiver; and said variable voltage control source is an AGC circuit of the receiver.

9. The signal path variable attenuation circuit of claim 1 wherein, both said input signal coupling means and output signal coupling means are RF signal coupling transformers.